United States Patent [19]

Murakami et al.

[11] Patent Number: 5,015,890

[45] Date of Patent: May 14, 1991

[54] SENSE AMPLIFIER HAVING PULL-UP CIRCUIT CONTROLLED BY FEEDBACK

[75] Inventors: Hiroaki Murakami, Tokyo; Osamu Matsumoto, Yokohama, both of Japan

[73] Assignee: Kabushiki Kaisha Toshiba, Kanagawa, Japan

[21] Appl. No.: 466,925

[22] Filed: Jan. 18, 1990

[30] Foreign Application Priority Data

Jan. 27, 1989 [JP] Japan .................. 1-18306

[51] Int. Cl.$^5$ .......................................... H03K 19/017
[52] U.S. Cl. ........................... 307/530; 307/451; 307/481
[58] Field of Search ............ 307/443, 449, 451–452, 307/465, 469, 481, 350, 530; 365/189.11, 205

[56] References Cited

U.S. PATENT DOCUMENTS

| 3,989,955 | 11/1976 | Suzuki | 307/452 X |
| 4,365,172 | 12/1982 | Prater | 307/449 X |
| 4,459,497 | 7/1984 | Kuo et al. | 307/530 |
| 4,494,020 | 1/1985 | Konishi | 307/530 |
| 4,614,883 | 9/1986 | Sood et al. | 307/449 |
| 4,799,195 | 1/1989 | Iwahashi et al. | 365/205 X |
| 4,825,106 | 4/1989 | Tipon et al. | 307/451 |
| 4,880,987 | 11/1989 | Steele | 307/443 |
| 4,916,334 | 4/1990 | Minagawa et al. | 365/189.11 X |
| 4,958,091 | 9/1990 | Roberts | 307/452 X |

OTHER PUBLICATIONS

"A 35ns 64K EEPROM", Richard D. Jolly et al., IEEE Journal of Solid State Circuits, vol. SC-20, No. 5, Oct., 1985.

Primary Examiner—David Hudspeth
Attorney, Agent, or Firm—Banner, Birch, McKie & Beckett

[57] ABSTRACT

A sense amplifier includes a first P channel MOS transistor connected between a power source terminal and a bit line, and a CMOS inverter for inverting the logic level of the potential in the bit line. The sense amplifier further includes a second N channel MOS transistor connected in series to the first P channel MOS transistor between the power source terminal and the bit line. The second N channel MOS transistor is switch-controlled by an output signal of a CMOS inverter. When in an off state, the second N channel MOS transistor prohibits the first P channel MOS transistor from transferring a power source potential to the bit line. When in an on state, the second N channel MOS transistor allows the first P channel MOS transistor to transfer the power source potential to the bit line.

16 Claims, 7 Drawing Sheets

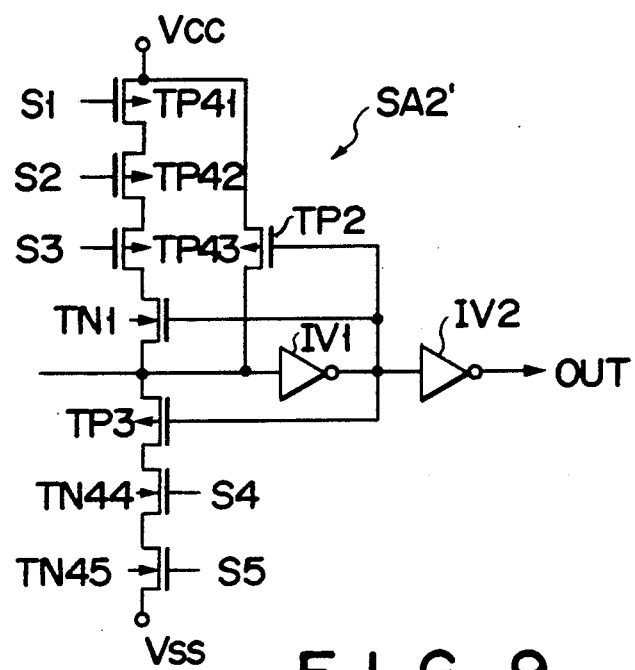
F I G. 9
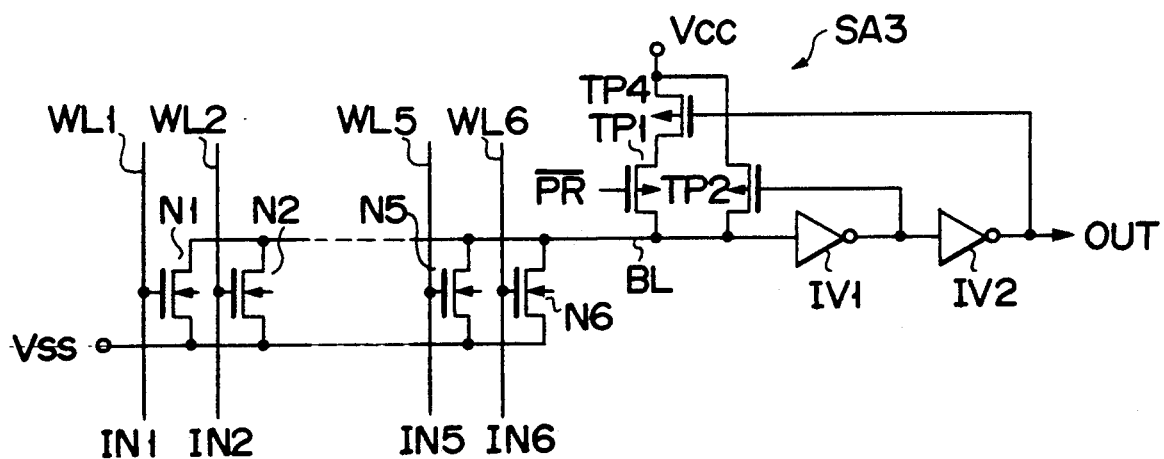
F I G. 10

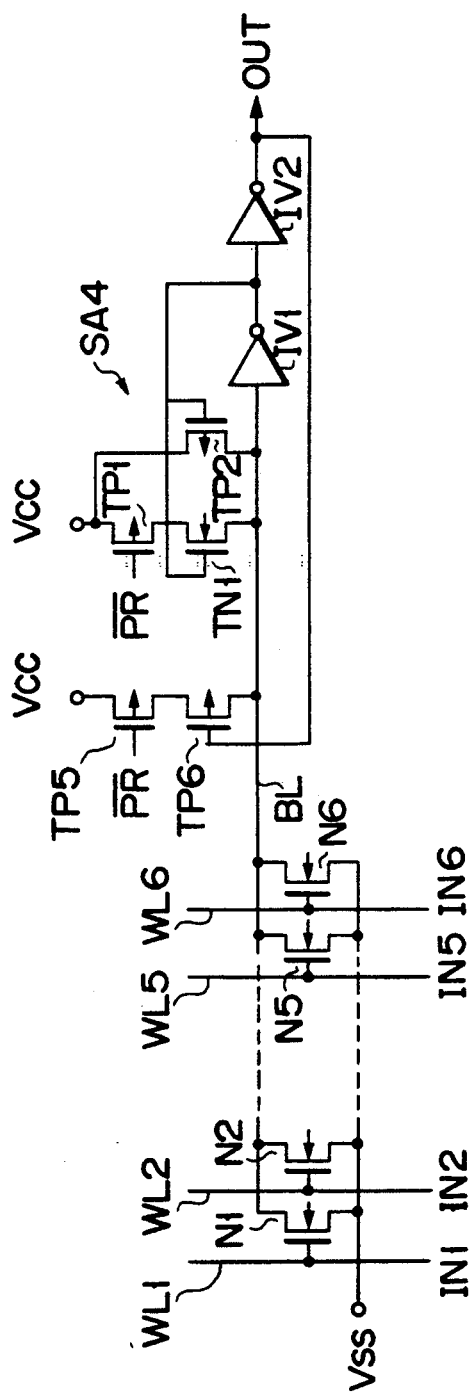
F I G. 11
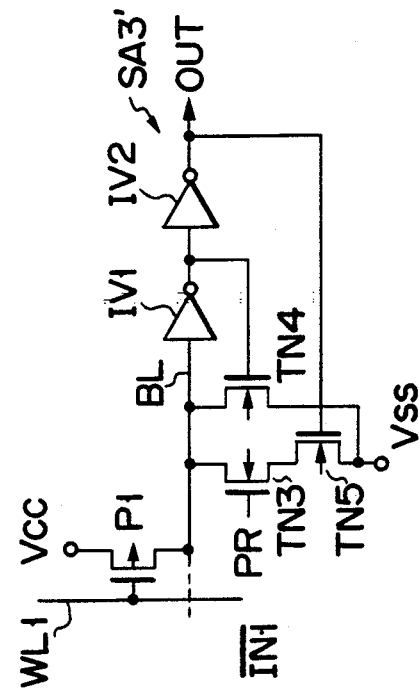
F I G. 12

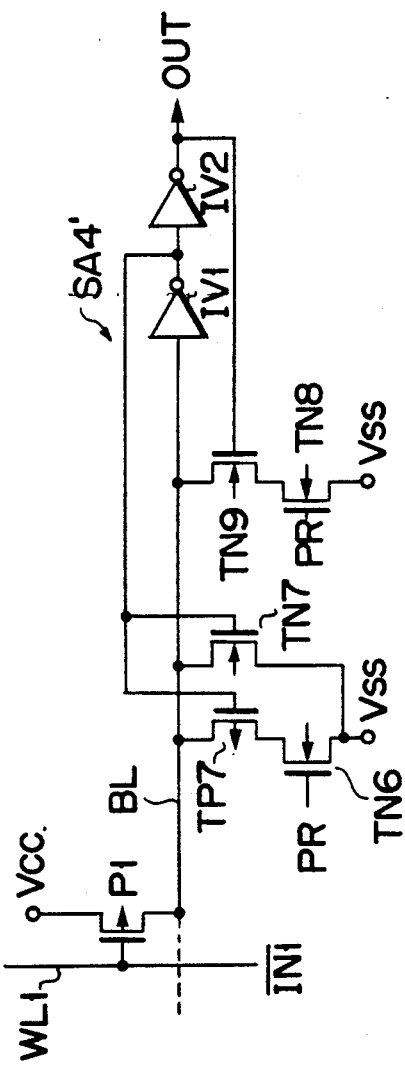
F I G. 13
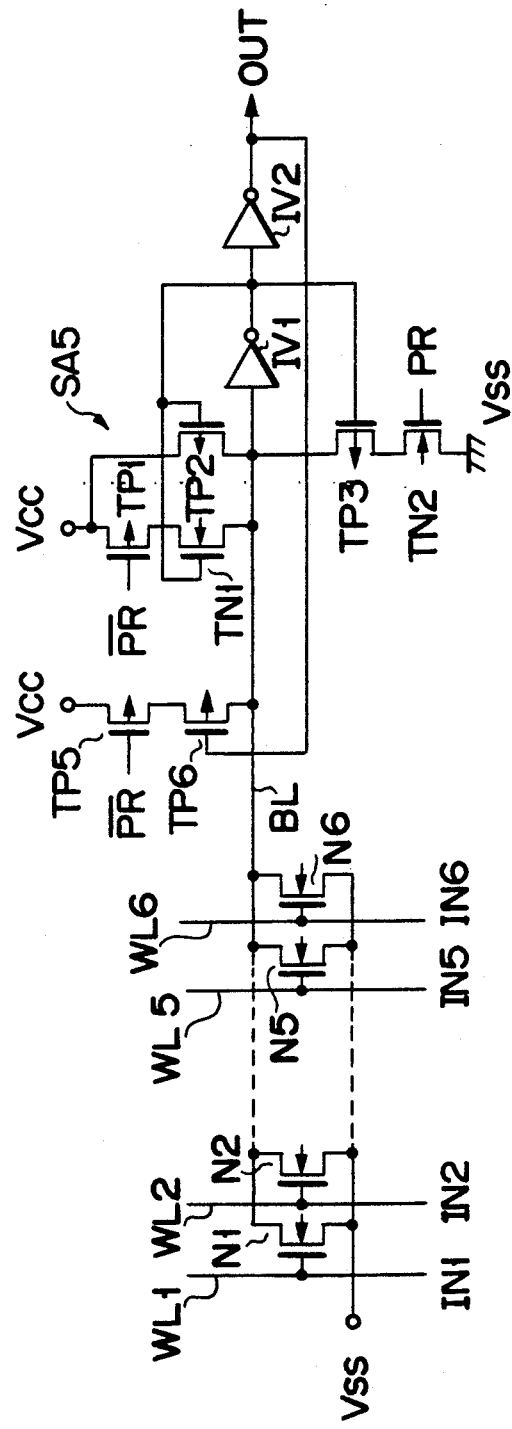
F I G. 14

SENSE AMPLIFIER HAVING PULL-UP CIRCUIT CONTROLLED BY FEEDBACK

BACKGROUND OF THE INVENTION

1. Field of the Invention

The present invention relates to a sense amplifier in use with a semiconductor memory device, such as a read only memory (ROM) and a random access memory (RAM).

2. Description of the Related Art

In a semiconductor memory device, such as a read only memory (ROM) or a random access memory (RAM), the potential in a bit line is varied by data read out of a memory cell. The variation of this bit line potential is very slow and difficult to detect. To cope with this, a sense amplifier is coupled with a bit line, and senses and amplifies variations in that bit line. The output signal of the sense amplifier is outputted as read out data.

A typical arrangement of the sense amplifier is shown in FIG. 1. In this figure, N channel MOS transistors N1 to N6 serve as memory cells, and their gates are respectively connected to word lines WL1 to WL6. Drive signals IN1 to IN6 are externally applied to the word lines WL1 to WL6. A sense amplifier SA is connected to a bit line BL, and is made up of P channel MOS transistors TP1 and TP2, and CMOS inverters IV1 and IV2.

An operation of the sense amplifier SA will be described with reference to FIGS. 2 and 3.

FIG. 2 shows a timing chart describing a transient state of the arrangement of FIG. 1 in which the potential in the bit line BL drops, viz., an output signal OUT changes its level from a high (H) level to a low (L) level. As shown in FIG. 2, in an initial state of a period A, all of the drive signals IN1 to IN6 are in an L level state. All of the transistors N1 to N6 are in an off state. A precharge signal $\overline{PR}$ is H level. Under this condition, the transistor TP1 is in an off state. The transistor TP2 is in an on state due to the L level output signal of the CMOS inverter IV1. By means of this transistor TP2, the potential in the bit line BL is maintained at an H level.

During a period B, the precharge signal $\overline{PR}$ first goes low (L), and one of the word line drive signals IN1 to IN6, for example the signal IN1, is pulsed from a low level to a high level. Consequently, the transistor TP1 is turned on, and the cell transistor N1 is turned on. The potential of the bit line BL gradually drops through the turned on transistor N1. When the potential of the bit line BL falls below the threshold voltage VTH1 of the inverter IV1, the output signal of the inverter IV1 starts to change its level from the L level to the H level. When the output signal of the inverter IV1 rises and exceeds the threshold voltage VTH2 of the inverter IV2, the output signal OUT of the inverter IV2 starts to change its level from the H level to the L level. The transistor TP2 is turned off by the H level output signal of the inverter IV1.

As can be seen, when the output signal OUT changes its potential level from the H level to the L level, the operating speed of the sense amplifier SA is determined by the propagation delay time TpHL from the instant that the drive signal IN1 has gone high, till the output signal OUT has gone low.

FIG. 3 shows a timing chart describing a transient state of the arrangement of FIG. 1 in which the potential in the bit line BL rises, viz. the output signal OUT changes its level from the low level to the high level. In an initial state of period A, one of the drive signals IN1 to IN6, for example the signal IN1, is in the H level. Accordingly, of the transistors N1 to N6, the transistor N1 alone is in an on state. The precharge signal $\overline{PR}$ is also in the H level. The transistor TP2 is placed in an off state by the H level output signal of the CMOS inverter IV1.

Subsequently, during period B, the precharge signal $\overline{PR}$ first goes low (L), and the word line drive signal IN1 goes low. Accordingly, the transistor TP1 is turned on, and the cell transistor N1 is turned off. In turn, the potential of the bit line BL starts to rise until it exceeds the threshold voltage VTH1 of the first inverter IV1. At this time, the output potential of the first inverter IV1 starts to change its potential level from a high level to a low level. When the output potential of the first inverter IV1 falls below the threshold voltage VTH2 of the second inverter IV2, the output signal of the second inverter IV2, viz. the output signal OUT, goes high. The low output signal of the inverter IV1 causes the transistor TP2 to be turned on, as a result of which, the potential of the bit line BL is kept high.

As can be seen, when the output signal OUT changes its potential level from low to high, the operating speed of the sense amplifier SA is determined by a propagation delay time TpLH from the instant that the precharge signal $\overline{PR}$ has gone low, till the output signal OUT has gone high.

In the sense amplifier SA, the propagation delay times TpLH and TpHL are both large, and hence the operating speed is low.

This problem will be discussed in more detail. It is assumed now that the on-resistance of the transistor TP1 (the resistance between the source and drain of the transistor TP1 when TP1 is in a conductive state) is RP1, the on-resistance of the transistor TP2 is RP2, the on-resistance of each of the cell transistors N1 to N6 is RN, the high level potential is VCC, the low level potential is 0 V, and the threshold voltage VTH1 of the first CMOS inverter IV1 is 2.5 V. In order that during the period B in FIG. 2, the potential VBL of the bit line BL is below the threshold voltage VTH1 of the first inverter IV1, the following relation must hold $$VBL = \frac{VCC \cdot RN}{RN + \frac{RP1 \cdot RP2}{RP1 + RP2}} < \frac{VCC}{2}$$

To solve the above relation, we have $$RN < \frac{RP1 \cdot RP2}{RP1 + RP2} \cdot \frac{2}{} \quad \ldots (1)$$

The inequality (1) teaches that in order that the bit line potential VBL is lower than the threshold voltage VTH1, the parallel resistance $$\frac{RP1 \cdot RP2}{RP1 + RP2}$$

of the transistors TP1 and TP2 must be larger than the on-resistance RN of the cell transistor N1.

Generally, in semiconductor memory devices, the geometrics of the cell transistors, which are formed on the chip, are the smallest allowable within the design rules. Therefore, the on-resistance RN is relatively large. Therefore, to set the parallel resistance of the transistors TP1 and TP2 to be larger than the on-resistance RN of the cell transistor, it is necessary to set the on-resistances RP1 and RP2 of the transistors TP1 and TP2 so as to be relatively large.

In the case of the sense amplifier SA of FIG. 1, the on-resistance of each of the cell transistors N1 to N6 to lower the potential of the bit line BL, and the on-resistance of each of the transistors TP1 and TP2 to raise the bit line potential are both relatively large. It is for this reason that much time is required for charging and discharging the bit line BL, the propogation delay times TpLH and TpHL are long, and consequently the operation of the sense amplifier SA is slow.

SUMMARY OF THE INVENTION

Accordingly, an object of the present invention is to provide a sense amplifier operable at high speed.

Another object of the present invention is to provide a sense amplifier which is operable at high speed, and is normally operable over a broad range of the power source voltage, for example, approximately 5 V to 2 V.

According to the present invention, there is provided a sense amplifier comprising: a first power source potential transfer portion coupled between a power source potential supply terminal and an input terminal, the power source potential transfer portion constantly or temporarily transferring a power source potential to the input terminal; an inverting portion for inverting the logic level of the potential at the input terminal; a first transistor of a first conductivity type, connected in series to the first power source potential transfer portion coupled between the power source potential supply terminal and the input terminal, which is switched by the output signal of the inverting portion and which, when switched off, prohibits the first power source potential transfer portion from transferring the power source potential to the input terminal, and when switched on, allows the first power source potential transfer portion to transfer the power source potential to the input terminal; a second transistor of a second conductivity type connected between the power source potential supply terminal and the input terminal, the first transistor being switched by the output signal of the inverting portion; and an signal output portion for producing a signal in accordance with the output signal of the inverting portion.

In the sense amplifier, when the first transistor is in an on state, the power source potential is not transferred to the input terminal. Therefore, in this situation, the potential at the input terminal is rapidly pulled down to a low level. Accordingly, the sense amplifier is operable at high speed.

BRIEF DESCRIPTION OF THE DRAWINGS

FIG. 9 is a circuit diagram showing a modification of the sense amplifier according to the second embodiment shown in FIG. 7;

FIG. 10 is a circuit diagram showing a sense amplifier according to a third embodiment of the present invention;

FIG. 11 is a circuit diagram showing a sense amplifier according to a fourth embodiment of the present invention;

FIG. 12 is a circuit diagram showing a modification of the sense amplifier according to the third embodiment shown in FIG. 10;

FIG. 13 is a circuit diagram showing a modification of the sense amplifier according to the fourth embodiment shown in FIG. 11;

FIG. 14 is a circuit diagram showing a sense amplifier according to a fifth embodiment of the present invention.

DETAILED DESCRIPTION OF THE PREFERRED EMBODIMENTS

A sense amplifier according to a first embodiment of the present invention will be described with reference to FIG. 4. In the figure, N channel MOS transistors N1 to N6 serve as memory cells. Their drains are connected together to the bit line BL, while their sources are connected together to a ground VSS terminal and their gates are respectively connected to word lines WL1 to WL6. The bit line BL is also connected to a sense amplifier SA1, according to a first embodiment of the present invention. The sense amplifier SA1 is for sensing and amplifying a variation of a potential in the bit line BL. The amplifier SA1 is made up of P channel MOS transistors TP1 and TP2, an N channel MOS transistor TN1, and CMOS inverters IV1 and IV2.

The input terminal of the CMOS inverter IV1 is connected to the bit line BL, and the output terminal, to the input of the CMOS inverter IV2. The output signal of the inverter IV2 is produced as an output signal OUT of the sense amplifier SA1. The transistors TP1 and TN1 are connected in series between the power source Vcc terminal and the bit line BL. The gate of the transistor TP1 is coupled for reception with a precharge signal $\overline{PR}$, while the gate of the transistor TN1 is coupled for reception with the output of the CMOS inverter IV1. The transistor TP2 is connected between the power source Vcc terminal and the bit line BL, and its gate receives the output signal from the CMOS inverter IV1.

Figure 1:
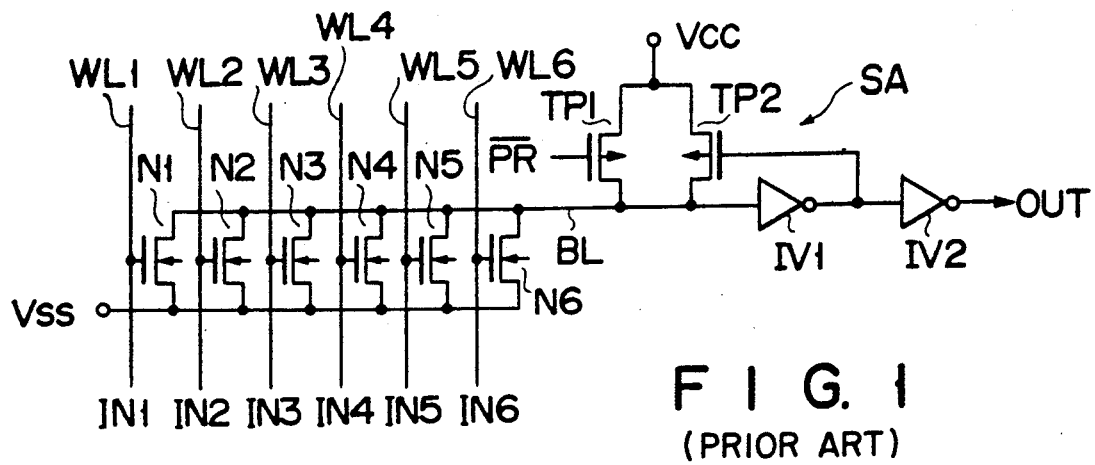
FIG. 1 is a circuit diagram showing a typical sense amplifier of the prior art.
Figure 2:
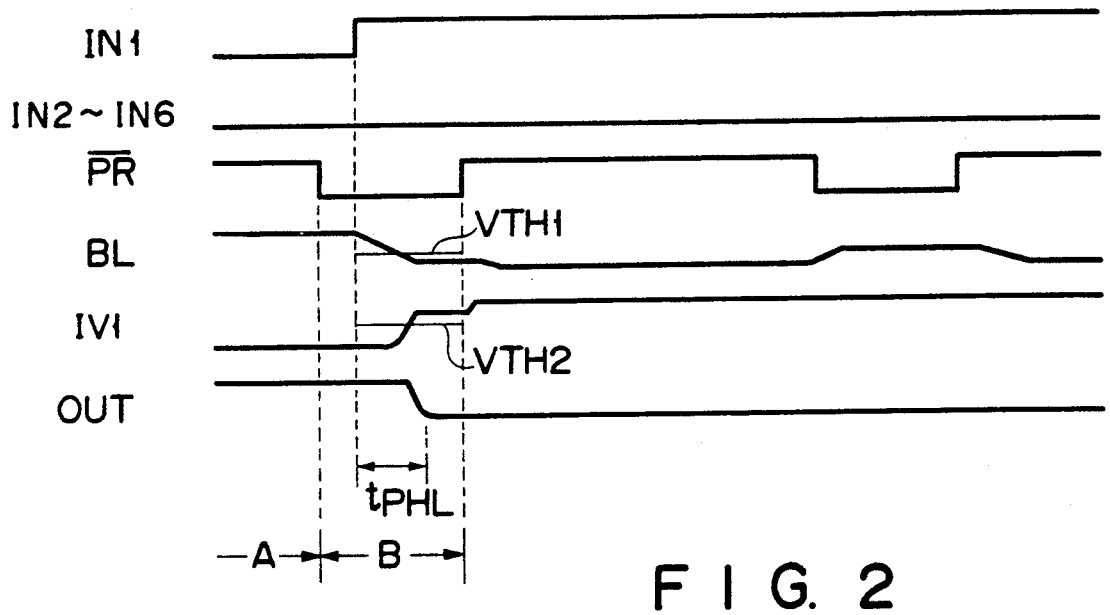
FIGS. 2 and 3 show timing charts useful in explaining an operation of the sense amplifier of FIG. 1.
Figure 3:
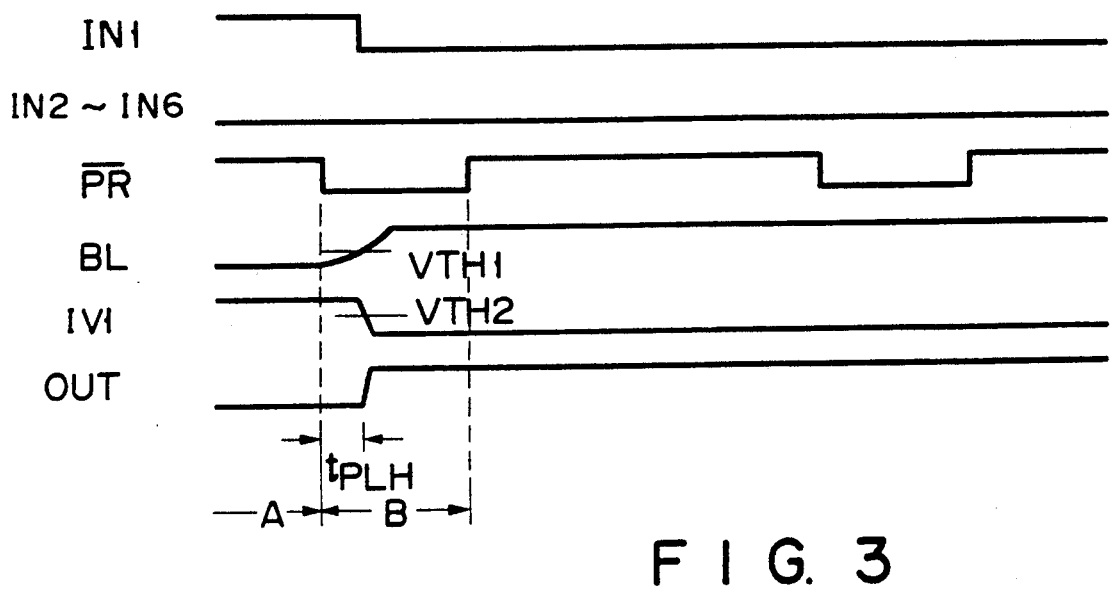

In the the sense amplifier SA1, because of the provision of the transistor TN1, the propagation delay times TpHL and TpLH are shorter than those in the sense amplifier SA of FIG. 1. As recalled, the time TpHL ranges from the instant that the drive signal IN1 has gone high till the output signal OUT has gone low. The time TpLH ranges from the instant that the precharge signal $\overline{PR}$ has gone low till the output signal OUT has gone high.

An operation of the sense amplifier SA1 shown in FIG. 4 will be described with reference to the timing charts shown in FIGS. 5 and 6.

Figure 4:
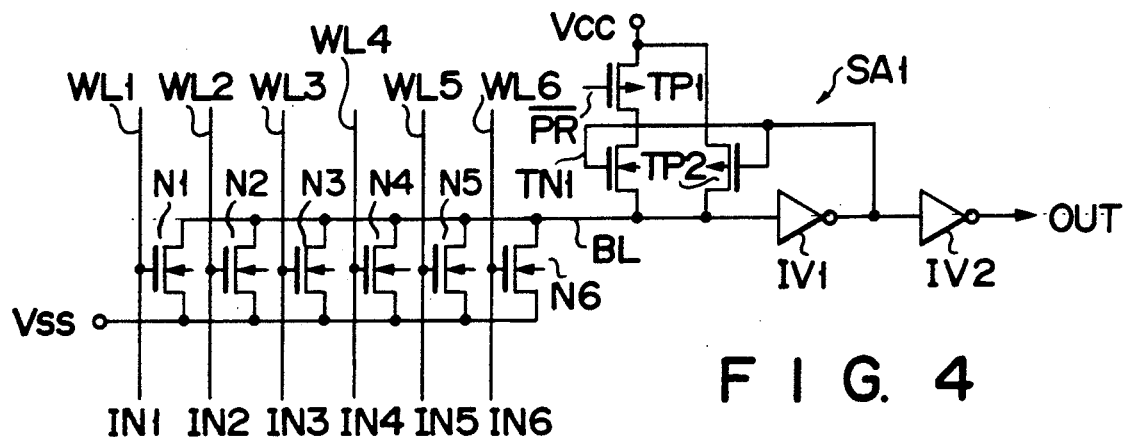
FIG. 4 is a circuit diagram showing a sense amplifier according to a first embodiment of the present invention.
Figure 5:
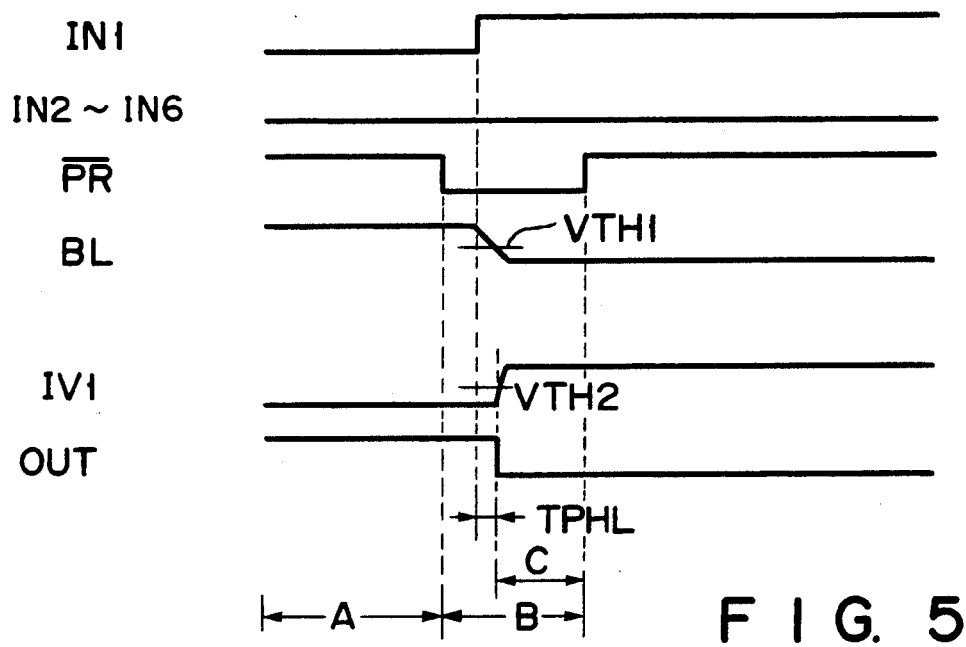
FIGS. 5 and 6 show timing charts useful in explaining an operation of the sense amplifier of FIG. 4.

FIG. 5 shows a timing chart describing a transient state of the arrangement of FIG. 4 in which the potential in the bit line BL drops, viz., the output signal OUT changes its level from an H level to a L level. As shown in FIG. 5, in the initial state of period A, all of the drive signals IN1 to IN6 are at L level. All of the transistors N1 to N6 are in an off state. A precharge signal $\overline{PR}$ is at H level. Under this condition, the transistor TP1 is in an off state. The transistor TP2 is placed in an on state by the L level output signal of the CMOS inverter IV1. By means of this transistor TP2, the potential in the bit line BL is maintained at the H level. The transistor TN1 is placed in an off state by the L level output signal of CMOS inverter IV1.

During period B, the precharge signal $\overline{PR}$ first goes low (L), and one of the word line drive signals IN1 to IN6, for example the signal IN1, is pulsed from the L level to the H level. Consequently, the transistor TP1 is turned on, and the cell transistor N1 is turned on. The potential of the bit line BL drops through the turned on cell transistor N1. In this case, the supply of the power source Vcc potential to the bit line BL is shut off by the off-state transistor TN1. Therefore, the potential of the bit line BL is rapidly reduced by the cell transistor N1. Normally, the on-resistance of the transistor TP2 is set at a very high value, therefore it influences the dropping rate of the potential of the bit line BL, very little. As a consequence, the transfer delay time TpHL, which ranges from the instant that the drive signal IN1 has gone high till the output signal OUT has gone low, is reduced. The switching speed of the sense amplifier SA1 is increased.

Figure 6:
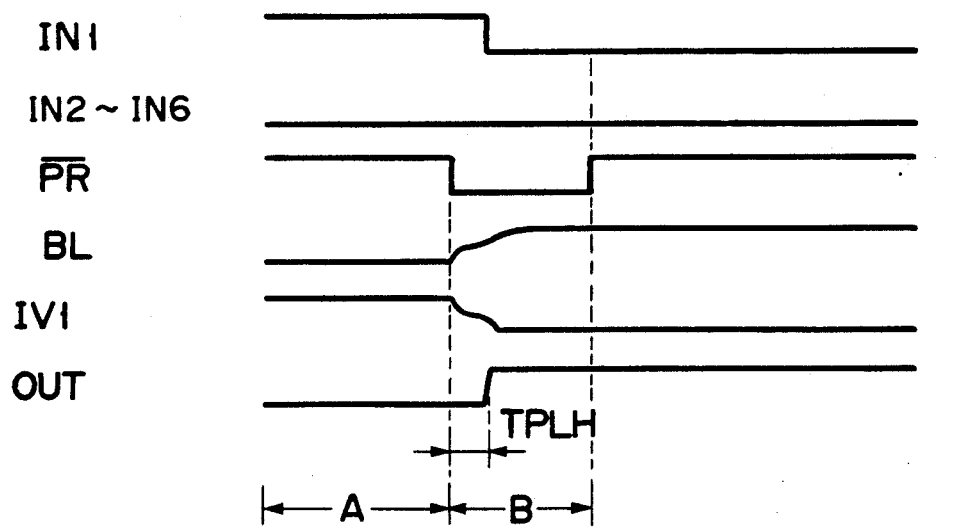

FIG. 6 shows a timing chart describing a transient state of the arrangement of FIG. 4 wherein the potential in the bit line BL rises, viz. the output signal OUT changes its level from the L level to the H level. In the initial state of period A, one of the drive signals IN1 to IN6, for example the signal IN1, is at H level. Accordingly, of the transistors N1 to N6, the transistor N1 alone is in an on state. The precharge signal $\overline{PR}$ is also at H level. Therefore, the transistor TP1 is placed in an off state. The bit line BL is kept at the L level by the on-state transistor N1. The output signal of the CMOS inverter IV1 is at the H level. The H level output signal of the inverter IV1 places the transistor TP2 in an off state, and the transistor TN1 in an on state.

Subsequently, during period B, the precharge signal $\overline{PR}$ first goes low, and the word drive signal IN1 goes low. Accordingly, the transistor TP1 is turned on, and the cell transistor N1 is turned off. In turn, the potential of the bit line BL starts to go high. As a result, a charge is supplied from the power source VCC terminal through the transistors TP1 and TN1 to the bit line BL and the potential of the bit line BL starts to go high. In this case, the on-resistance of the transistor TP1 is set at a relatively low value. Furthermore, the on-resistance of the transistor TN1 is also relatively low until the potential of the bit line BL rises to be in high level. Accordingly, the potential of the bit line BL rapidly goes higher than that of the sense amplifier of FIG. 1. As a consequence, the propagation delay time TpLH, which ranges from the instant that the precharge signal $\overline{PR}$ has gone low till the output signal OUT has gone high, is reduced. The switching speed of the sense amplifier SA1 is increased.

The reason why the on-resistance of the transistor TP1 in the sense amplifier SA1 may be smaller than that of the conventional sense amplifier of FIG. 1 will be discussed in more detail. It is assumed now that the on-resistance of the transistor TP1 is RP1; the on-resistance of the transistor TP2 is RP2; on-resistance of the transistor TN1 is RN1; on-resistance of each of the cell transistors N1 to N6 is RN; high level potential is VCC; low level potential is 0 V; and the threshold voltage VTH1 of the first CMOS inverter IV1 is Vcc/2. In order that, during the period C in FIG. 5, the potential VBL of the bit line BL is kept below the threshold voltage VTH1 of the first inverter IV1, the following relation must hold $$VBL = \frac{Vcc \cdot RN}{RN+RP1+RN1} < \frac{Vcc}{2}$$

To solve the above relation, we have $$RN < RP1 + RN1 \ldots \quad (2)$$

The beforementioned inequality (2) teaches that in order that the bit line potential VBL is lower than the threshold voltage VTH1, the serial resistance of the transistors TP1 and TN1 must be larger than the on-resistance RN of the cell transistor N1.

Since the N channel MOS transistor TN1 is connected at the source to the bit line BL, the on-resistance RN1 of the transistor TN1 increases by the back-gate effect when the potential of the bit line BL increases. For this reason, if the on-resistance RP1 of the transistor TP1 in the sense amplifier SA1 is smaller than the on-resistance of the transistor TP1 in the conventional sense amplifier SA of FIG. 1, the relation (2) can be satisfied.

Therefore, the on-resistance of the transistor TP1 for charging the bit line BL may be set at a small value. The propagation delay time TpLH, from the instant that the precharge signal $\overline{PR}$ has gone low, till the output signal OUT has gone high, is reduced. As a result, the switching speed of the sense amplifier SA1 is increased.

In the above first embodiment, transistor TP1 is temporary set in an on-state by precharge signal $\overline{PR}$. It is also possible to use a normally-on transistor or a load resistor in place of transistor TP1. Like in the first embodiment, a high-speed operation of sense amplifier SA1 can be achieved.

Figure 7:
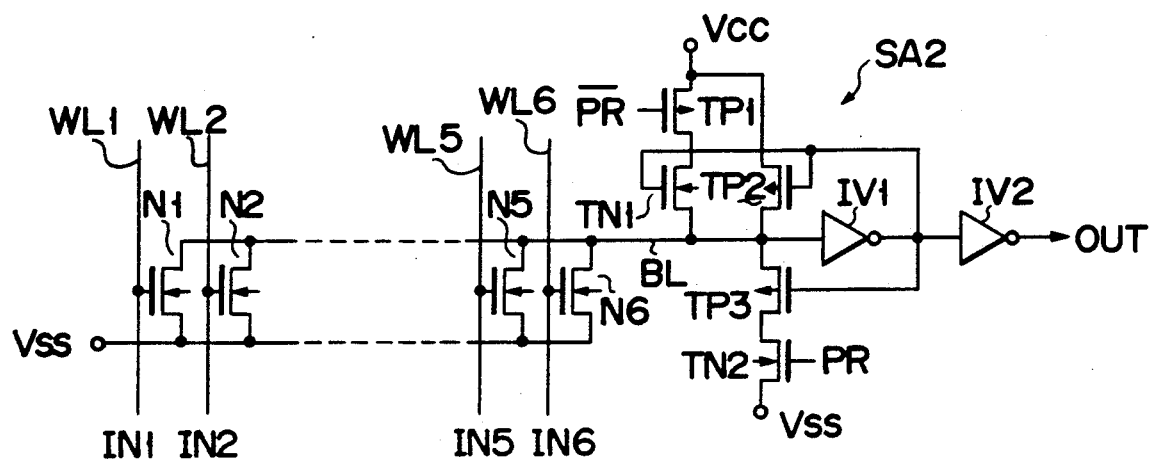
FIG. 7 is a circuit diagram showing a sense amplifier according to a second embodiment of the present invention.

FIG. 7 shows a sense amplifier according to a second embodiment of the present invention. The sense amplifier SA2 contains a P channel MOS transistor TP3 and an N channel transistor TN2, in addition to the arrangement of the sense amplifier SA1 of the first embodiment. The transistors TP3 and TN2 are connected in series between the bit line BL and the ground Vss terminal. The output signal of the CMOS inverter IV1 is applied to the gate of the transistor TP3. An inverted signal PR of the precharge signal $\overline{PR}$ is applied to the gate of the transistor TN2.

In the sense amplifier SA2, the potential of the bit line BL is reduced by not only the cell transistor N1 but also the transistors TP3 and TN2. The propagation delay time TpLH, from when the drive signal IN1 has gone high till when the output signal OUT has gone low, is further reduced from that of the first embodiment.

A transient state of the sense amplifier SA2 wherein the potential in the bit line BL drops, viz. an output signal OUT changes its level from an H level to an L level, will be described with reference to FIG. 8.

Figure 8:
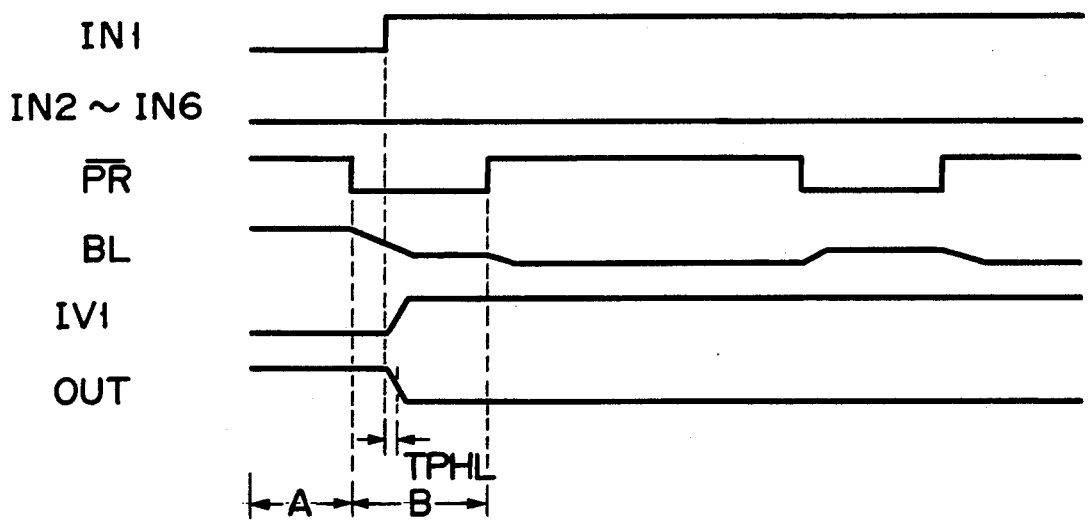
FIG. 8 shows a timing chart useful in explaining an operation of the sense amplifier of FIG. 7.

As shown in FIG. 8, in an initial state of a period A, all of the drive signals IN1 to IN6 are at L level. All of the cell transistors N1 to N6 are in an off state. A precharge signal $\overline{PR}$ is H level. Under this condition, the transistor TP1 is in an off state. The transistor TP2 is placed in an on state by the L level output signal of the CMOS inverter IV1. By this transistor TP2, the potential in the bit line BL is maintained at the H level. The transistor TN1 is placed in an off state by the L level output signal of the inverter IV1, the transistor TP3 is in an on state due to the L level output signal of the inverter IV1, and the transistor TN2 is in an off state due to the L level signal PR.

During a period B, the precharge signal $\overline{PR}$ first goes low, and one of the word line drive signals IN1 to IN6, for example the signal IN1, is pulsed from the L level to the H level. Consequently, the transistor TP1 is turned on by the L level precharge signal $\overline{PR}$, and the transistor TN2 is turned on by the H level signal PR. Then, the cell transistor N1 is turned on by the H level signal IN1.

The potential of the bit line BL starts to drop at the instant that the precharge signal $\overline{PR}$ goes low, as shown in FIG. 8. At that instant, the transistor TN2 is turned on by the H level signal PR, so that the bit line BL is discharged through the series current path of the transistors TP3 and TN2.

As described above, in the sense amplifier SA2, the reduction of the bit line BL is quickened. This reduces the propagation delay time TpHL, which ranges from the instant that the drive signal IN1 has gone high till the output signal OUT has gone low. The reduction of the propagation delay time TpHL in this second embodiment is greater than that in the first embodiment.

In a transient state of the sense amplifier SA2 wherein the potential in the bit line BL rises, viz. the output signal OUT changes its level from the L level to H level, the transistor TP3 remains in its off state till the bit line potential reaches the threshold voltage of the inverter IV1. Accordingly, the discharge path for the bit line BL, which contains the transistors TP3 and TN2, is shut off. The propagation delay time TpLH of the sense amplifier SA2 of the second embodiment, which ranges from the moment the precharge signal $\overline{PR}$ has gone low till the moment the output signal OUT has gone high, is equal to that of the sense amplifier SA1 of the first embodiment.

FIG. 9 shows a modification of the sense amplifier SA2 according to the second embodiment of the present invention. The sense amplifier SA2' is different from the sense amplifier SA2 in the following respects.

As shown, in the sense amplifier SA2', three P channel MOS transistors TP41 to TP43 are used in place of the P channel MOS transistor TP1 in the sense amplifier SA2 of the second embodiment. Further, two N channel MOS transistors TN44 and TN45 are provided in place of the N channel MOS transistor TN2. The transistors TP41 to TP43 are connected in series between the power source Vcc terminal and the drain of the transistor TN1. Control signals S1 to S3 are coupled with the gates of the transistors TP41 to TP43, respectively. The transistors TN44 and TN45 are connected in series between the drain of the transistor TP3 and the ground Vss terminal. Control signals S4 and S5 are coupled with the gates of the transistors TN44 and TN45, respectively.

In the sense amplifier SA2', the transistors TP41 to TP43 are set in an on state when the control signals S1 to S3 are L level. The transistors TN44 and TN45 are set in an on state when the control signals S4 and S5 are H level. Accordingly, the logic level of each of the control signals S1 to S3 varies similarly to the precharge signal $\overline{PR}$ in the timing chart of FIG. 8. The logic levels of each of the control signals S4 and S5 vary the inverted signal PR of the precharge signal $\overline{PR}$. Accordingly, the sense amplifier SA2' operates like the sense amplifier SA2 of the second embodiment.

The sense amplifiers SA1, SA2 and SA2' normally operate when the power source voltage Vcc is near 5 V. When the voltage Vcc drops to a low voltage, e.g., 2 V, however, the sense amplifiers operate improperly, because the output signal OUT is left at the L level and will not rise to the H level. This improper operation of the sense amplifier SA1 will be described on the assumption that the voltage of Vcc terminal is 2 V, the threshold voltage VTH1 of the first inverter IV1 is 1 V, and that VTHN of the N channel MOS transistor TN1 is 1 V.

The output signal OUT of the sense amplifier SA1 changes its signal level from the L level to the H level, as shown in FIG. 6, when the bit line voltage is in the L level, and the precharge signal $\overline{PR}$ changes its level from the H level to the L level, and then the drive signal IN1 changes its level from the H level to the L level. The potential of the bit line BL is increased up to a value that is smaller than the power source potential Vcc by the threshold voltage VTH1 of the transistor TN1, viz., Vcc−VTH1. When the power source potential Vcc is 2 V, and the threshold voltage VTH1 of the transistor TN1 is 1 V, the bit line voltage is increased up to only 1 V, i.e., 2 V−1 V=1 V. In this case, the bit line potential, 1 V, is not higher than the threshold voltage VTH1 of the first inverter IV1, and the output of the inverter IV1 remains high level. Accordingly, the output signal OUT is left low and it will not change its level to the high or H level.

A sense amplifier SA3 of a third embodiment according to the present invention will be described with reference to FIG. 10. The sense amplifier SA3 is arranged so as to normally be operable with a range of the power source potential Vcc between 5 V and 2 V. The sense amplifier SA3 is different from SA1 shown in FIG. 4 in the following respects. In the sense amplifier SA3, a P channel MOS transistor TP4 is used in place of the N channel MOS transistor TN1 of the sense amplifier SA1. The transistor TP4 is connected in series to the transistor TP1 between the bit line BL and the power source Vcc terminal. The gate of the transistor TP4 receives the output signal of the second CMOS inverter IV2.

The basic operation of the sense amplifier SA3 is substantially the same as that of the sense amplifier SA1 of the first embodiment. The output signal OUT of the sense amplifier SA3 changes its signal level from the L level to the H level, as in the the sense amplifier SA1, when the bit line voltage is in the L level, and the precharge signal $\overline{PR}$ changes its level from the H level to the L level, and then the drive signal IN1 changes its level from the H level to the L level. In this case, the bit line potential is increased up to about the power source potential Vcc. When the potential Vcc is 2 V and the the threshold voltage VTH1 of the inverter IV1 is 1 V, the bit line potential is 2 V. This bit line potential satisfactorily higher than the voltage VTH1. Accordingly, the H level signal outputted from the inverter IV1 drops to the L level. Consequently, the output signal OUT also changes its level from the L level to the H.

Thus, the sense amplifier SA3 is normally operable in the range between 5 V to 2 V of the power source potential Vcc, because the transistor TP4 is used.

Also in this embodiment, the transistor TP4 is switched in the same manner as the transistor TN1 in the sense amplifier SA1. Accordingly, the propagation delay time TpHL can be reduced as in the sense amplifier SA1.

A fourth embodiment of a sense amplifier according to the present invention will be described with reference to FIG. 11. The sense amplifier SA4 is operable by the power source potential Vcc between 5 V to 2 V. The transfer delay time TpLH is shorter than that of the sense amplifier SA3 of the third embodiment.

The sense amplifier SA4 contains the arrangement of the sense amplifier SA1 of FIG. 4, which is provided with two additional P channel MOS transistors TP5 and TP6, which are connected in series between the power source Vcc terminal and the bit line BL. The gate of the transistor TP5 receives the precharge signal $\overline{PR}$ and the gate of the transistor TP6 receives the output signal of the second CMOS inverter IV2.

In the sense amplifier SA4, the level of the output signal OUT changes from the L level to the H level, when the bit line voltage is in the L level, and the level of the precharge signal $\overline{PR}$ changes from the H level to the L level, and then the level of the drive signal IN1 changes from the H level to the L level. In this case, the potential of the bit line BL is increased up to about the power source potential Vcc by the two transistors TP5 and TP6. When the power source potential Vcc is 2 V, and the threshold voltage VTH1 of the transistor TN1 is 1 V, the bit line voltage, 2 V, is satisfactorily higher than the threshold voltage VTH1 of the first inverter IV1. Therefore, the H level signal outputted from the first inverter IV1 is inverted by the bit line potential and changes to the potential of the L level. Accordingly, the level of the output signal OUT also changes from the L level to the H level.

Thus, the sense amplifier SA4 is normally operable in the range between 5 V and 2 V of the power source potential Vcc, because the transistors TP5 and TP6 are used.

When the bit line potential is in the L level and the precharge signal $\overline{PR}$ changes its level from the H level to the L level, then the drive signal IN1 changes its level from the H level to the L level, the bit line BL is charged not only by the transistors TP5 and TP6, but also by the transistors TP1 and TN1. Therefore, the bit line BL is more rapidly charged to a value above the threshold voltage of the inverter IV1 than that of the sense amplifier SA3. Therefore, the propagation delay time TpLH is shorter than that of the sense amplifier SA3.

FIG. 12 shows a modification of the sense amplifier SA3 according to the third embodiment of the present invention shown in FIG. 10. The feature of the sense amplifier SA3' is that P channel MOS transistors are used as cell transistors.

In the sense amplifier SA3', a P channel type cell transistor P1, and N channel MOS transistors TN4, TN5 and TN3 are used in place of the cell transistor N1 and P channel MOS transistors TP2, TP4 and TP1 of the sense amplifier SA3. The cell transistor P1 is connected between the power source Vcc terminal and the bit line BL, and its gate is connected to the word line WL1. The word line WL1 is connected for reception to the drive signal IN1, the transistors TN3 and TN5 are connected in series between the bit line BL and the ground Vss terminal, the output signal of the second CMOS inverter IV2 is supplied to the gate of the transistor TN5, and the transistor TN4, whose gate receives the output signal of the first CMOS inverter IV1, is connected between the bit line BL and the ground Vss terminal.

The sense amplifier SA3' also is normally operable within the range of 5 V to 2 V of the power source potential Vcc.

FIG. 13 shows a modification of the sense amplifier SA4 according to the fourth embodiment of the present invention shown in FIG. 11. The sense amplifier SA4' of FIG. 13 is featured in that P channel MOS transistors are used as cell transistors.

In the sense amplifier SA4', a P channel type cell transistor P1, N channel MOS transistors TN6 to TN9, and a P channel MOS transistor TP7 are respectively used in place of the cell transistor N1, the P channel MOS transistors TP1, TP2, TP5, and TP6, and the N channel MOS transistor TN1 of the sense amplifier SA4. The cell transistor P1 is connected between the power source Vcc terminal and the bit line BL, and its gate is connected to the word line WL1, which is coupled for reception with the drive signal IN1. The transistors TP7 and TN6 are connected in series between the bit line BL and the ground Vss terminal. The gate of the transistor TN6 receives the inverted signal PR of the precharge signal $\overline{PR}$ and the gate of the transistor TP7 receives the output signal of the first CMOS inverter IV1. The transistor TN7 is connected between the bit line BL and the ground Vss terminal, and its gate receives the output signal of the inverter IV1. The transistors TN9 and TN8 are connected in series between the bit line BL and the ground Vss terminal, the gate of the transistor TN9 receiving the output signal of the inverter IV2, while the inverted signal PR of the precharge signal $\overline{PR}$ is applied to the gate of the transistor TN8.

The sense amplifier SA4' may also attain advantageous effects similar to those of the sense amplifier SA4.

FIG. 14 shows a sense amplifier SA5 of a fifth embodiment of the present invention. The sense amplifier SA5 is equivalent to a combination of the sense amplifier SA4 of FIG. 11 and the sense amplifier SA2 of FIG. 7. The sense amplifier SA5 includes the P channel MOS transistor TP3 and the N channel MOS transistor TN2 of the sense amplifier SA2, in addition to the P channel MOS transistors TP1, TP2, TP5, and TP6, the N channel MOS transistor TN1, and the CMOS inverters IV1 and IV2 in the sense amplifier SA4.

The sense amplifier SA5 thus arranged is normally operable within the power source potential Vcc range of 5 V to 2 V. The bit line BL is rapidly charged by the transistors TP1, TN1, TP5 and TP6. The bit line BL is rapidly discharged by the transistors TP3, TN2 and the cell transistor. Therefore, the propagation delay times TpHL and TpLH can both be further reduced.

As described above, the sense amplifiers SA1 to SA5 of the first to fifth embodiments of the present invention are operable at high speed. The sense amplifiers of the third to fifth embodiments are normally operable within the range of the power source voltage between 5 V and 2 V. For the above reason, the sense amplifier according to the present invention is most suitable for a semiconductor memory device with a multi-bit output arrangement in which the power source voltage tends to vary, particularly a PLD (programmable logic device) as shown in FIG. 15.

Figure 15:
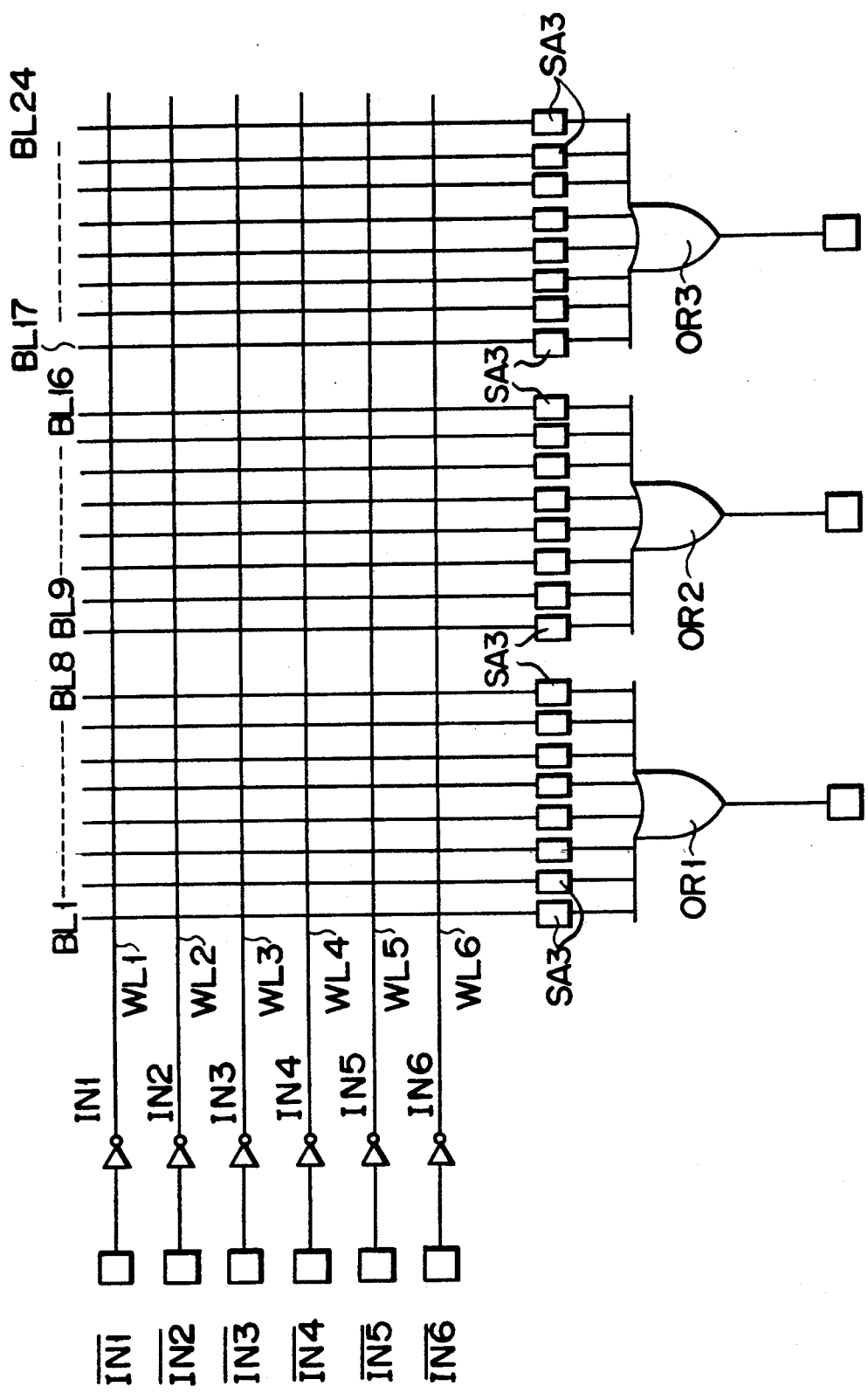
FIG. 15 is a circuit diagram showing a programmable logic device to which each of the embodiments of the present invention is applicable.

In the PLD shown in FIG. 15, sense amplifiers of the same type as the sense amplifier SA3 of the third embodiment are respectively coupled with bit lines BL1 to BL24. Variations in the bit lines BL1 to BL8 are sensed and amplified by the sense amplifiers SA3, and supplied to an 8-input OR gate OR1; Variations in the bit lines BL9 to BL16 are sensed and amplified by the sense amplifiers SA3, and supplied to an 8-input OR gate OR2; Variations in the bit lines BL17 to BL24 are sensed and amplified by the sense amplifiers SA3, and supplied to an 8-input OR gate OR3.

A PLD must have such a structure that realizes a high-speed operation, when a CMOS standard IC is implemented using the PLD. The PLD shown in FIG. 15 has the sense amplifier SA3 of the present invention, and can operate at a high-speed due to the function of the sense amplifier SA3. Therefore, the PLD shown in FIG. 15 may be used instead of the conventionally used CMOS standard IC. In addition, since the sense amplifier SA3 is operable in the power source voltage range of 5 V to 2 V, the PLD shown in FIG. 15 may be incorporated into a handy type consumer appliance which is required to operate at a low voltage.

What is claimed is:

1. A sense amplifier comprising:
   first power source potential transfer means coupled between a power source potential supply terminal and an input terminal, said power source potential transfer means constantly or temporarily transferring the power source potential to said input terminal;
   inverting means for inverting the logic level of the potential at said input terminal;
   a first transistor of a first conductivity type connected in series to said first power source potential transfer means between said power source potential supply terminal and said input terminal, said first transistor being switch-controlled by the output signal of said inverting means, said first transistor prohibiting said first power source potential transfer means from transferring the power source potential to said input terminal when said first transistor is off-state, and said first transistor allowing said first power source potential transfer means to transfer the power source potential to said input terminal when said first transistor is on-state; and
   a second transistor of a second conductivity type connected between said power source potential supply terminal and said input terminal, said second transistor being switch-controlled by the output signal of said inverting means.

2. The sense amplifier according to claim 1, in which said first power source potential transfer means includes a third transistor of the second conductivity type, said third transistor being temporarily turned on by a first precharge signal from exterior.

3. The sense amplifier according to claim 1, further comprising:
   reference potential transfer means connected between said input terminal and a reference potential supply terminal, said reference potential transfer means constantly or temporarily transferring the reference potential to said input terminal; and
   a third transistor of the second conductivity type connected in series to said reference potential transfer means between said reference potential supply terminal and said input terminal, said third transistor being switch-controlled by said inverting means, said third transistor prohibiting said reference potential transfer means from transferring the reference potential to said input terminal when said third transistor is in a off-state, and said third transistor allowing said reference potential transfer means to transfer the reference potential to said input terminal when said third transistor is in an on-state.

4. The sense amplifier according to claim 3, in which said reference potential transfer means includes a fourth transistor of the first conductivity type, said fourth transistor being temporarily turned on by a second precharge signal from exterior.

5. The sense amplifier according to claim 1, further comprising signal output means which includes a second inverting means for inverting the logic level of an output signal of said inverting means.

6. The sense amplifier according to claim 5, further comprising:
   second power source potential transferring means connected between said power source potential supply terminal and said input terminal, said second power source potential transferring means constantly or temporarily transferring the power source potential to said input terminal; and
   a third transistor of the second conductivity type connected in series to said second power source potential transfer means between said power source potential supply terminal and said input terminal, said third transistor being switch-controlled by the output signal of said second inverting means of said signal output means, said third transistor prohibiting said second power source potential transfer means from transferring the power source potential to said input terminal when said third transistor is in an off-state, and said third transistor allowing said second power source potential transfer means to transfer the power source potential to said input terminal when said third transistor is in an on-state.

7. The sense amplifier according to claim 3, further comprising signal output means which includes a second inverting means for inverting the logic level of an output signal of said inverting means.

8. The sense amplifier according to claim 7, further comprising:
   second power source potential transferring means connected between said power source potential supply terminal and said input terminal, said second power source potential transferring means constantly or temporarily transferring the power source potential to said input terminal; and
   a third transistor of the second conductivity type connected in series to said second power source potential transfer means between said power source potential supply terminal and said input terminal, said third transistor being switch-controlled by the output signal of said second inverting means of said signal output means, said third transistor prohibiting said second power source potential transfer means from transferring the power source potential to said input terminal when said third transistor is in an off-state, and said third transistor allowing said second power source potential transfer means to transfer the power source potential to said input terminal when said third transistor is in an on-state.

9. The sense amplifier according to claim 1, in which said input terminal is connected to one end of a cell transistor whose another end is coupled with said reference potential supply terminal.

10. The sense amplifier according to claim 1, in which said sense amplifier senses and amplifies a variation of each bit line of a programmable logic device.

11. A sense amplifier comprising:
first power source potential transfer means coupled between a power source potential supply terminal and an input terminal, said power source potential transfer means constantly or temporarily transferring the power source potential to said input terminal;
first inverting means for inverting the logic level of the potential at said input terminal;
second inverting means for inverting the output signal of said first inverting means and outputting the inverted signal as an output signal;
a first transistor of a first conductivity type connected in series to said first power source potential transfer means between said power source potential supply terminal and said input terminal, said first transistor being switch-controlled by the output signal of said second inverting means, said first transistor prohibiting said first power source potential transfer means from transferring the power source potential to said input terminal when said first transistor is in an off-state, and said first transistor allowing said first power source potential transfer means to transfer the power source potential to said input terminal when said first transistor is in an on-state, and
a second transistor of a first conductivity type connected between said power source potential supply terminal and said input terminal, said first transistor being switch-controlled by the output signal of said inverting means.

12. The sense amplifier according to claim 11, in which said first power source potential transfer means includes a third transistor of the first conductivity type, said third transistor being temporarily turned on by a first precharge signal from exterior.

13. The sense amplifier according to claim 11, further comprising:
reference potential transfer means connected between said input terminal and a reference potential supply terminal, said reference potential transfer means constantly or temporarily transferring the reference potential to said input terminal; and
a third transistor of the first conductivity type connected in series to said reference potential transfer means between said reference potential supply terminal and said input terminal, said third transistor being switch-controlled by said first inverting means, said third transistor prohibiting said reference potential transfer means from transferring the reference potential to said input terminal when said third transistor is in an off-state, and said third transistor allowing said reference potential transfer means to transfer the reference potential to said input terminal when said third transistor is in an on-state.

14. The sense amplifier according to claim 13, in which said reference potential transfer means includes a fourth transistor of the second conductivity type, said fourth transistor being temporarily turned on by a second precharge signal from exterior.

15. The sense amplifier according to claim 11, in which said input terminal is connected to one end of the cell transistor whose another end is coupled with said reference potential supply terminal.

16. The sense amplifier according to claim 11, in which said sense amplifier senses and amplifies a variation of each bit line of a programmable logic device.

* * * * *